(12) United States Patent
Fornara et al.

(10) Patent No.: US 8,532,947 B2
(45) Date of Patent: Sep. 10, 2013

(54) METHOD OF IDENTIFYING AN INTEGRATED CIRCUIT AND CORRESPONDING INTEGRATED CIRCUIT

(75) Inventors: Pascal Fornara, Pourrières (FR); Mathieu Lisart, Aix en Provence (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 362 days.

(21) Appl. No.: 12/969,266

(22) Filed: Dec. 15, 2010

(65) Prior Publication Data

US 2011/0153245 A1 Jun. 23, 2011

(30) Foreign Application Priority Data

Dec. 22, 2009 (FR) ...................................... 09 59355

(51) Int. Cl.
*G01R 19/00* (2006.01)
*G06F 19/00* (2011.01)

(52) U.S. Cl.
USPC .............. 702/65; 382/124; 702/115; 702/122

(58) Field of Classification Search
USPC ................... 702/62, 4, 65, 73, 106, 115, 122, 702/123, 64, 117, 118; 340/539.2, 573.2; 382/124; 455/435.2; 713/176, 189
See application file for complete search history.

(56) References Cited

U.S. PATENT DOCUMENTS

| | | | |
|---|---|---|---|
| 5,434,917 A | 7/1995 | Naccache et al. | |
| 5,787,174 A | 7/1998 | Tuttle | |
| 6,018,686 A | 1/2000 | Orso et al. | |
| 6,830,941 B1 | 12/2004 | Lin et al. | |
| 2005/0207624 A1* | 9/2005 | Ehlers et al. ................... | 382/124 |
| 2009/0094566 A1 | 4/2009 | Bueti et al. ....................... | 716/3 |

FOREIGN PATENT DOCUMENTS

| | | |
|---|---|---|
| WO | 2006/055645 | 5/2006 |
| WO | 2007/028150 | 3/2007 |

* cited by examiner

*Primary Examiner* — John H Le
(74) *Attorney, Agent, or Firm* — Allen, Dyer, Doppelt, Milbrath & Gilchrist, P.A.

(57) ABSTRACT

An integrated circuit includes non-volatile storage configured to secretly store a digital word, the value of which forms an identification code. The integrated circuit also includes control circuitry configured to receive the digital word and to generate transient electrical currents or transient voltages, the characteristics of which depend on the value of the digital word. There is an electrically conductive network configured to be passed through by the electrical currents or receive the transient voltages so as to generate an electromagnetic field that identifies the integrated circuit.

16 Claims, 7 Drawing Sheets ered confidentially in the
integrated circuit.

METHOD OF IDENTIFYING AN INTEGRATED CIRCUIT AND CORRESPONDING INTEGRATED CIRCUIT

FIELD OF THE INVENTION

The invention relates to integrated circuits, and the identification thereof, in particular, but not exclusively, to allow their traceability.

BACKGROUND OF THE INVENTION

Integrated circuit packages often appear externally similar to one another. Therefore, it may be difficult to tell one integrated circuit package from another when it is desirable to do so. For example, a manufacturer may wish to know what batch a given integrated circuit belongs to, or when a given integrated circuit was fabricated. Similarly, a manufacturer may with to be able to quickly identify a model number of type of the chip.

Integrated circuits typically have marking indicia on an external surface thereof. However, this marking indicia may be difficult to read, both via the human eye and via an electronic reader. As such, new methods of identifying an integrated circuit are desirable.

SUMMARY OF THE INVENTION

According to one implementation and embodiment, there is a method of identifying an integrated circuit that allows easy non-invasive identification, that is to say that does not destroy the integrated circuit, and that makes it possible to discover an identification code contained confidentially in the integrated circuit.

According to one implementation and embodiment, an identification code is based on conventional metal lines, for example produced in the interconnect part of an integrated circuit and the identification comprises detection of electromagnetic field traces caused by variations in currents flowing along these metal lines or by voltage variations generated on these metal lines. The characteristics of these current or voltage variations are determined by data stored secretly, or at least in a manner that is difficult to detect, when the integrated circuit is electrically customized, in a storage circuitry or means, for example a storage circuitry or means of a non-volatile and electrically programmable and erasable type (for example EEPROM).

According to one aspect, there is thus a method of identifying an integrated circuit, comprising producing an electromagnetic field using an electrically conductive network produced within an integrated circuit and passed through by transient electrical currents or subjected to transient voltages (or voltage variations), the characteristics of which depend on the value of a digital word forming an identification code of the integrated circuit and stored secretly in a non-volatile memory and an analysis of the electromagnetic field produced so as to discover or not the identification code.

The storage, secretly or at least in a manner that is difficult to detect, in a non-volatile memory can be obtained, for example, by storage in a protected read-only memory or else an EEPROM-type memory or even a FLASH-type memory.

According to one variant, the electrically conductive network comprises at least one pair of electrically conductive means or circuitry, for example at least one pair of metal lines, associated with a bit of the digital word. The characteristics of the transient currents comprise the direction of flow of the transient current in an electrically conductive means or circuitry. Two transient currents of the same direction or opposite direction depending on the value of the bit are then made to flow in the two electrically conductive means or circuitry of the pair, and the magnetic field produced above each of the electrically conductive means or circuitry and between the two electrically conductive means or circuitry is analysed.

This analysis is used to determine whether the logic value of the bit is equal to 1 or to 0. Generally, the electrically conductive network comprises a number of pairs of electrically conductive means or circuitry mutually spaced apart by a distance greater than the area of analysis of a magnetic field analysis means or circuitry, for example a probe equipped with an antenna-forming loop tuned with the antenna formed by the pairs of electrically conductive means or circuitry. In practice, this distance is much greater than the diameter of the loop of the magnetic probe. Each pair is associated with a bit of the digital word and two transient currents of opposite directions or the same direction depending on the value of the bit associated with the pair are made to flow in the two electrically conductive means or circuitry of each pair, and the magnetic field produced above each of the electrically conductive means or circuitry and between the two electrically conductive means or circuitry of each pair is analyzed with the analysis means or circuitry.

According to another variant, the electrically conductive network comprises at least one electrically conductive means or circuitry, for example a metal line, associated with a bit of the digital word, the characteristics of the transient voltages comprising a generation or an absence of generation of a transient voltage or voltage variation in an electrically conductive means or circuitry; a voltage variation is then generated or not in the electrically conductive means or circuitry according to the value of the bit, and the possible presence of an electrical field produced above the electrically conductive means or circuitry is detected.

This presence of the electrical field can be detected by capacitive coupling between the metal line and the analysis probe.

There again, according to one implementation of this variant, the electrically conductive network generally comprises a number of electrically conductive means or circuitry mutually spaced apart by a distance greater than the area of analysis of an electrical field analysis means or circuitry, each electrically conductive means or circuitry being associated with a bit of the digital word, and a voltage variation is generated or not in each electrically conductive means or circuitry according to the value of the bit associated with it and the possible presence of an electrical field produced above each electrically conductive means or circuitry is detected.

The non-volatile memory can be a read-only memory of the electrically programmable and erasable type.

According to another aspect, there is proposed an integrated circuit comprising a non-volatile storage means or circuitry configured to secretly store a digital word, the value of which forms an identification code of the integrated circuit, control means or circuitry configured to receive the digital word and to generate transient electrical currents or transient voltages, the characteristics of which depend on the value of the digital word, and an electrically conductive network configured to be passed through by the transient electrical currents or receive the transient voltages so as to generate an electromagnetic field.

According to one embodiment, the electrically conductive network comprises at least one pair of electrically conductive means or circuitry associated with a bit of the digital word, the control means or circuitry being configured to define the direction of flow of the transient current in an electrically conductive means or circuitry according to the value of the bit.

According to one embodiment, the electrically conductive network comprises a number of pairs of electrically conductive means or circuitry mutually spaced apart by a distance greater than the area of analysis of a magnetic field analysis means or circuitry, each pair being associated with a bit of the digital word, the control means or circuitry being configured to make two transient currents of the same direction or opposite direction depending on the value of the bit associated with the pair flow in the two electrically conductive means or circuitry of each pair.

According to one embodiment, the two electrically conductive means or circuitry of each pair respectively comprise two parallel electrically conductive lines.

As a variant, the electrically conductive network comprises at least one electrically conductive means or circuitry associated with a bit of the digital word, the control means or circuitry being configured to generate or not a transient voltage or voltage variation in an electrically conductive means or circuitry according to the value of the bit.

According to one embodiment, the electrically conductive network comprises a number of electrically conductive means or circuitry mutually spaced apart by a distance greater than the area of analysis of an electrical field analysis means or circuitry, each electrically conductive means or circuitry being associated with a bit of the digital word, the control means or circuitry being configured to generate or not in each electrically conductive means or circuitry a voltage variation according to the value of the bit associated with it.

According to one embodiment, each electrically conductive means or circuitry is an electrically conductive line.

According to one embodiment, the non-volatile storage means or circuitry comprises a content-addressable type memory comprising, for each stored bit, two EEPROM-type memory points connected by two inverters mounted head-to-tail.

According to one embodiment, the control means or circuitry comprise at least one multiplexer, the output of which is connected to at least one end of at least one electrically conductive means or circuitry, controlled by the value of the bit associated with this electrically conductive means or circuitry, and having a first input intended to receive a voltage signal comprising at least one voltage pulse.

BRIEF DESCRIPTION OF THE DRAWINGS

Other advantages and features of the invention will become apparent from studying the detailed description of implementations and embodiments that are in no way limiting, and the appended drawings, in which.

DETAILED DESCRIPTION OF THE PREFERRED EMBODIMENTS

Figure 1:
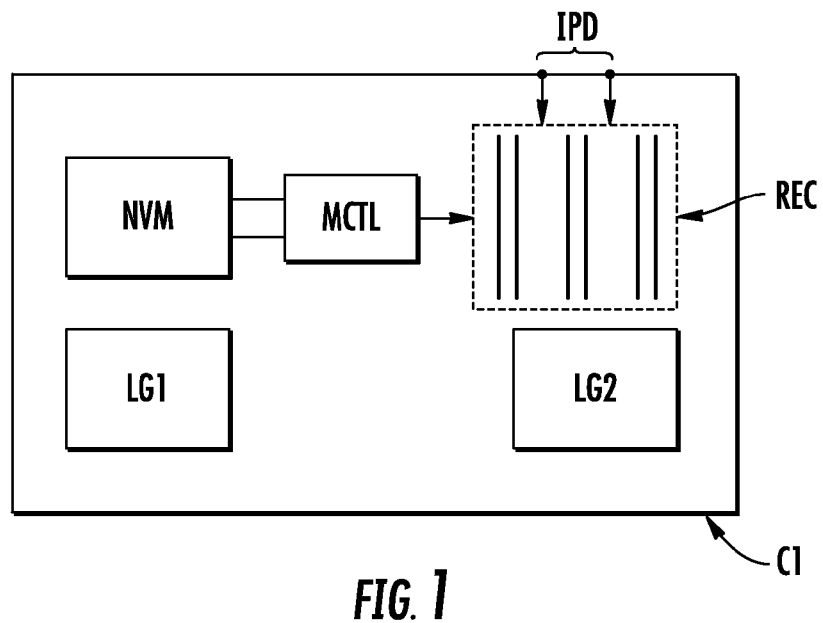
FIG. 1 diagrammatically illustrates one embodiment of an integrated circuit according to the invention.

In FIG. 1, the reference CI designates an integrated circuit comprising, for example, logic blocks LG1, LG2, it being understood that the functionality of these blocks is not limiting, the latter possibly also being replaced by blocks of microcontrollers for example.

In addition to these conventional integrated circuit elements, the integrated circuit CI comprises a non-volatile memory means or circuitry NVM which can be, for example, a protected read-only memory, or a memory of the flash type, or even a memory of the electrically programmable and erasable non-volatile type, as well known to those skilled in the art as "EEPROM memory".

This non-volatile memory means or circuitry NVM is intended to contain, secretly or at least in a manner that is difficult to detect, a digital word in which the bit values define an identification code of the integrated circuit.

This identification code is, for example, stored in the memory NVM when the integrated circuit is electrically customized.

The integrated circuit also comprises an electrically conductive network REC comprising, in this example, pairs of electrically conductive means or circuitry such as metal lines. Control means or circuitry MCTL, the structure of which will be seen in more detail hereinbelow, are intended to generate transient electrical currents (or current variations) in the electrically conductive network REC, the characteristics of which depend on the value of the digital word, and therefore on the identification code stored in the memory means or circuitry NVM.

As will be seen in more detail hereinbelow, the transient electrical currents are produced notably from pulsed voltage signals supplied to input terminals IPD, such as test input terminals, connected to the electrically conductive network REC.

These transient electrical currents will generate an electromagnetic field, the characteristics of which are linked to the characteristics of the transient currents and consequently to the identification code. The analysis of this electromagnetic field will be used to identify or not identify the integrated circuit CI.

Figure 2:
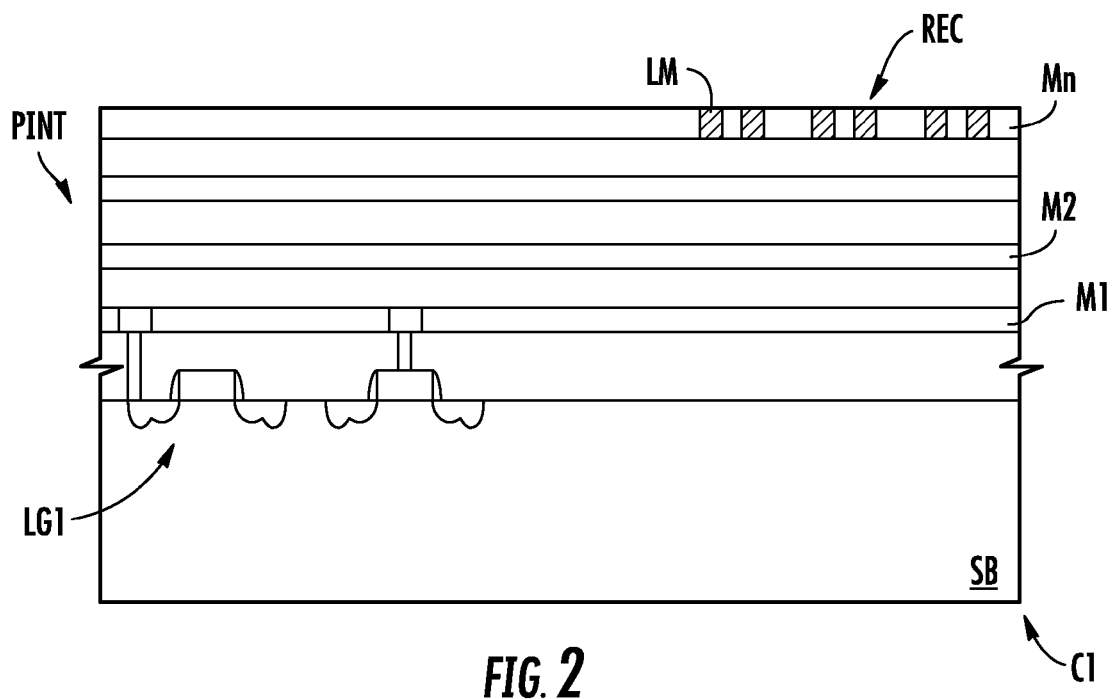
FIG. 2 illustrates in more detail a part of the integrated circuit of FIG. 2, FIGS. 3 to 5 illustrate a first variant of the invention, FIGS. 6 to 8 diagrammatically illustrate embodiments of a non-volatile storage means or circuitry and of means or circuitry for controlling an integrated circuit according to the invention, FIG. 9 diagrammatically illustrates one embodiment of a measurement bench according to the invention, and FIGS. 10 and 11 diagrammatically illustrate another variant of the invention.

As illustrated in FIG. 2, the electrically conductive network REC can be produced on top of the substrate SB in the interconnect part PINT of the integrated circuit, commonly designated by those skilled in the art as "BEOL" (Back-End-Of-Lines), for example on a relatively high metallization level Mn of the integrated circuit. In the example described here, the electrically conductive means or circuitry that make up the network REC are formed by parallel metal lines, for example made of copper, LM, to be produced in a conventional manner. These metal lines or tracks are conventionally mutually separated by a dielectric and are also electrically insulated from the adjacent metallization levels by a dielectric.

Although this electrically conductive network REC can be arranged anywhere in the integrated circuit, it is preferable to arrange it in a place that is not situated on the vertical to the logic blocks, so as to avoid in particular any potential interference.

A first variant provides for the use (FIG. 3 in particular) of a magnetic probe SDH comprising a loop, the diameter or area of analysis of which is greater than the spacing d1 between the two metal lines LMG1 and LMD1 of a pair, to detect and determine the intensity of the magnetic field created by the flow of the transient currents in the two metal lines.

Typically, the spacing d1 is, for example, around 10 microns, whereas the diameter of the loop of the magnetic probe SDH is around 50 microns.

Figure 3:
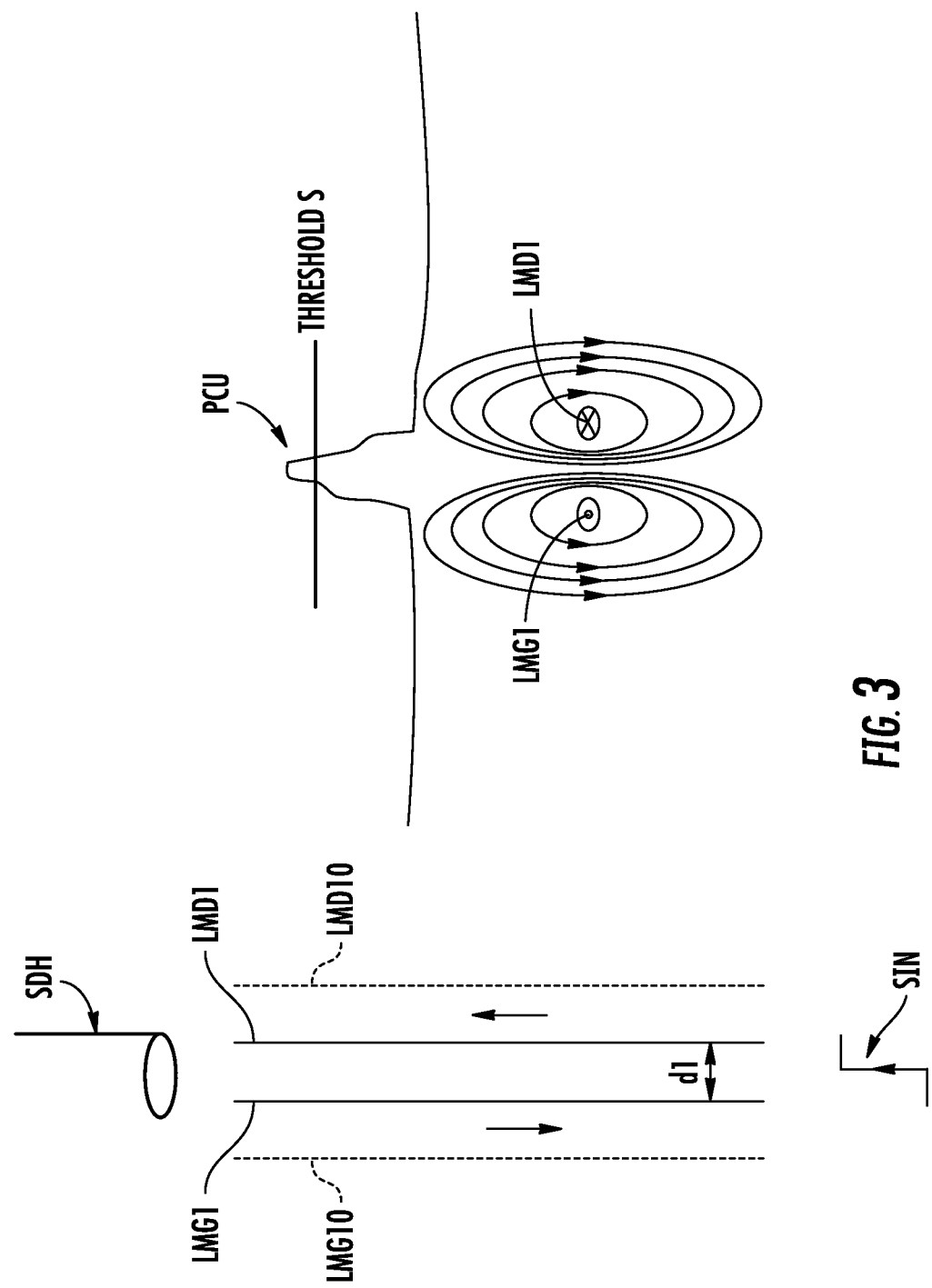

The configuration illustrated in FIG. 3 is that in which, in response to pulsed voltage signals, the transient currents flow in reverse directions in the two lines LMG1 and LMD1. The flow of these transient currents creates an electromagnetic field, of which the field lines of the magnetic component of this field are represented in the right-hand part of FIG. 3.

Since the two transient currents flow in reverse directions, it can be seen that the intensity of the magnetic field exhibits a peak PCU between the two metal lines. This peak PCU is greater than a predetermined threshold S. The fact that the intensity of the magnetic field exceeds the threshold S is then representative, for example, of the logic value 1 of the bit of the identification code associated with this pair of metal lines.

The magnetic field created by the pair of antenna-forming lines depends on the intensity of the transient current flowing in this antenna and decreases with the distance relative to the antenna. Moreover, the loop of the probe SDH also forms an antenna which, according to its dimension, will be tuned to the antenna formed by the two metal lines at a certain frequency.

Generally, this frequency may be, for example, between 10 kHz and 135 kHz, resulting in a detection of the "near field" type by inductive coupling with a range of around a few tens of centimetres.

As an indication, the current flowing in the metal lines may be around one milliampere.

Although, generally, it is sufficient to provide, for each electrically conductive means or circuitry of the pair, a single metal line, it may be particularly advantageous, so as in particular to increase the intensity of the magnetic field, to provide for each electrically conductive means or circuitry of the pair to include not one metal line but a number of metal lines, preferably parallel, LMG1-LMG10 or LMD1-LMD10. In this case, all the metal lines LMG1-LMG10 of the same electrically conductive means or circuitry are passed through by a transient current of the same direction.

Figure 4:
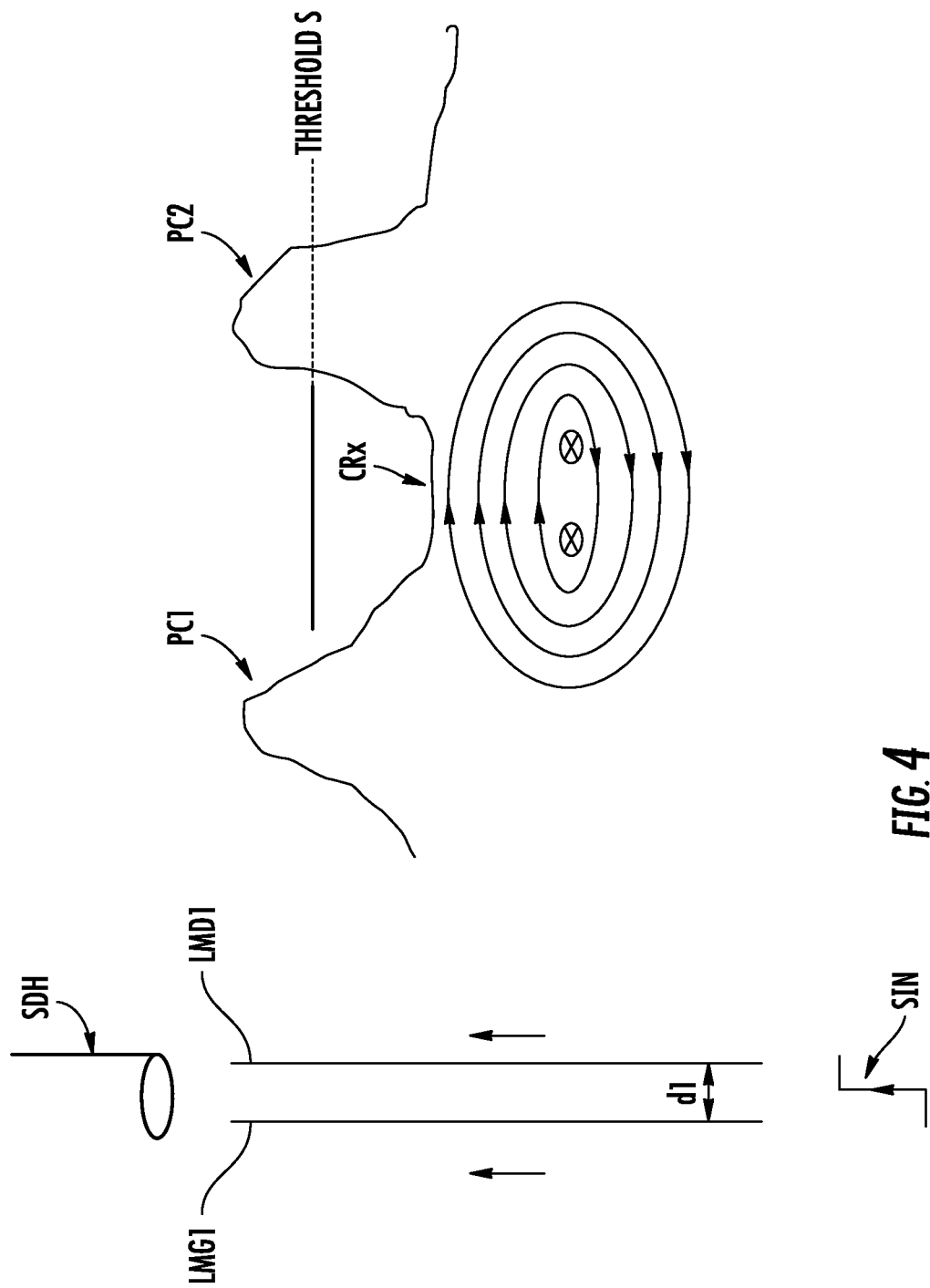

FIG. 4 illustrates the configuration in which the two metal lines LMG1 and LMD1 of the pair of metal lines are passed through by a transient current of the same direction. In this case, as illustrated in the right-hand part of FIG. 4, the intensity of the magnetic field exhibits two peaks PC1 and PC2 above the threshold S. These two peaks PC1 and PC2 are separated by a dip CRX situated below the threshold S and situated approximately between the two metal lines LMG1 and LMD1.

The detection of a dip between two peaks thus makes it possible to identify such a configuration which is, for example, representative of the logic value "0" of the bit associated with the pair of metal lines.

Figure 5:
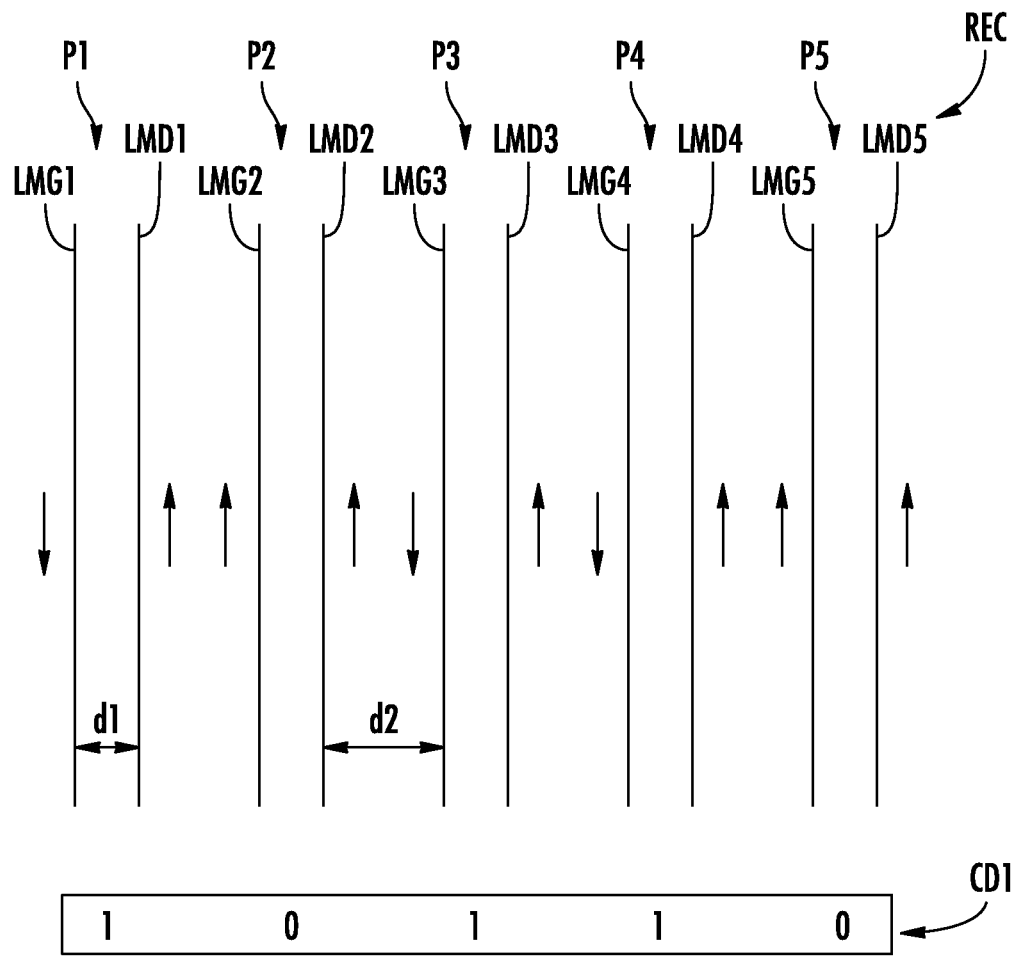

FIG. 5 illustrates the case where the electrically conductive network comprises a number of pairs of metal lines P1-P5.

In this example, the identification code CDI stored in the non-volatile memory means or circuitry NVM comprises five bits, the values of which are illustrated in FIG. 5. These values therefore determine the directions of the currents in the various metal lines.

Moreover, two pairs of adjacent lines Pi and Pi+1 are spaced apart by a distance greater than the area of analysis of the magnetic probe, this spacing d2 being, for example, around 100 microns.

To identify the integrated circuit, the network REC is fed with test signals, typically voltage transitions, and the magnetic probe is moved over the electrically conductive network REC and the magnetic field is analyzed. Also, if characteristics of the magnetic field (peaks and dips) are found that correspond to the value of the digital word 1 0 1 1 0 stored in memory, the integrated circuit will be considered to have been identified.

Figure 6:
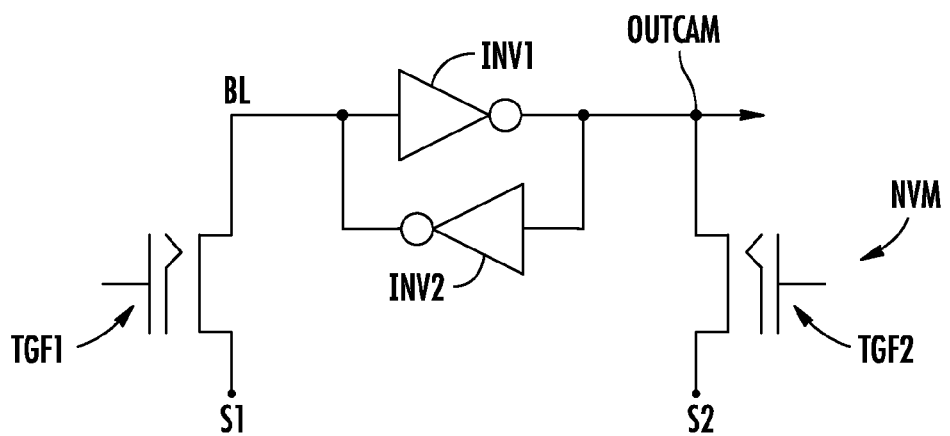

FIG. 6 illustrates an exemplary embodiment of a non-volatile memory means or circuitry NVM of the content-addressable type (content-addressable memory, CAM, to use an acronym well known to those skilled in the art).

More specifically, the memory NVM of the content-addressable type comprises, for each stored bit, two EEPROM-type memory points connected by two inverters INV1 and INV2 mounted head-to-tail.

Each EEPROM memory point comprises a floating gate transistor TGF1, TGF2, the sources S1 and S2 of which are linked to ground.

When, at the time of electrical customization of the integrated circuit, the left-hand memory point of the cell of FIG. 6 is programmed whereas the right hand memory point of this cell is erased, it is considered that the cell stores, for example, a logic "1".

In practice, after a precharging of the node BL with the power supply voltage Vdd and then releasing of the precharge, the transistor TGF1 will be ON whereas the transistor TGF12 will be OFF, resulting in the delivery of a "1" at the output OUTCAM.

However, if the two memory points have been erased upon storage of the identification code, this corresponds to the storage of a logic "0". In practice, after a precharging of the node BL with the power supply voltage Vdd and then release of the precharge, a logic "0" will be delivered.

Such a structure offers the advantage of delivering the content of the memory provided that a voltage is available, and does so even if the rest of the integrated circuit is damaged.

Figure 7:
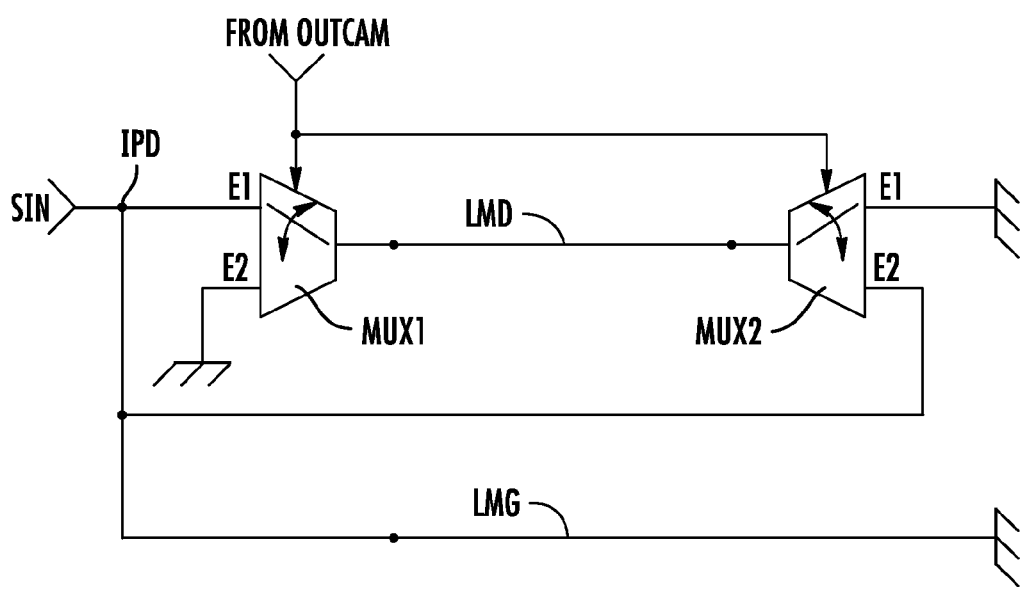

FIG. 7 illustrates an example of control means or circuitry MCTL that can be used to generate the currents in one direction or in the other in the two lines LMG and LMD of a pair of metal lines.

More specifically, in this non-limiting example, one of the metal lines of the pair, for example the line LMD, is connected between the outputs of two multiplexers MUX1 and MUX2. The control input of each multiplexer is connected to the output OUTCAM of the memory cell associated with this pair of metal lines.

Figure 8:
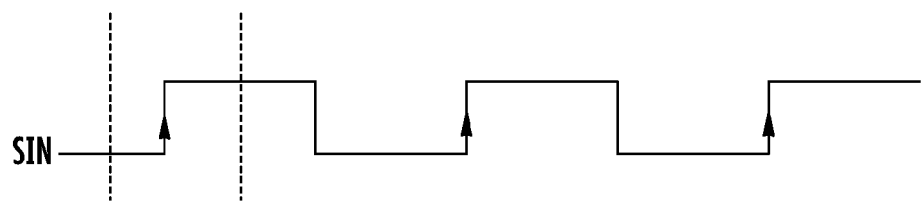

The first input of the multiplexer MUX1 is likely to receive the test signal SIN which, as illustrated in FIG. 8, is a 0-5 volt signal for example, in pulse form.

The second input E2 of the multiplexer MUX2 is also likely to receive this signal SIN.

The inputs E2 and E1 of the multiplexers MUX1 and MUX2 are also linked to ground.

The other metal line, for example the line LMG, is likely to receive, at one of its ends, the signal SIN and has its other end linked to ground.

Thus, in the case where the two multiplexers MUX1 and MUX2 are placed on their first input. E1, the two lines LMD and LMG are passed through by transient currents of the same direction.

However, when the two multiplexers MUX1 and MUX2 are placed on their input E2, the two metal lines are passed through by transient currents of opposite directions.

The detection and the analysis of the magnetic field are performed during analysis windows FA encompassing each rising transition of the signal SIN.

As a variant, it would be possible to eliminate the multiplexer MUX2 and leave the end of the line LMD unconnected. Moreover, the second input E2 of the multiplexer MUX1 will be linked to the IPD terminal via an inverter.

In this case, if the multiplexer MUX1 is placed on its input E1, the positive transition of SIN during the analysis window FA charges the line LMD which is both resistive and capacitive and causes a transient current to flow from left to right. Obviously, the intensity of the current is strongest in the vicinity of the output of the multiplexer producing a magnetic field that is more intense in this area.

If the multiplexer MUX1 is placed on its input E2, the negative transition of the opposite of the signal SIN during the analysis window FA discharges the line LMD and causes a transient current to flow from right to left.

In this variant, what has just been described for the line LMD is valid for each line. This variant has the advantage of offering lower electrical consumption.

Figure 9:
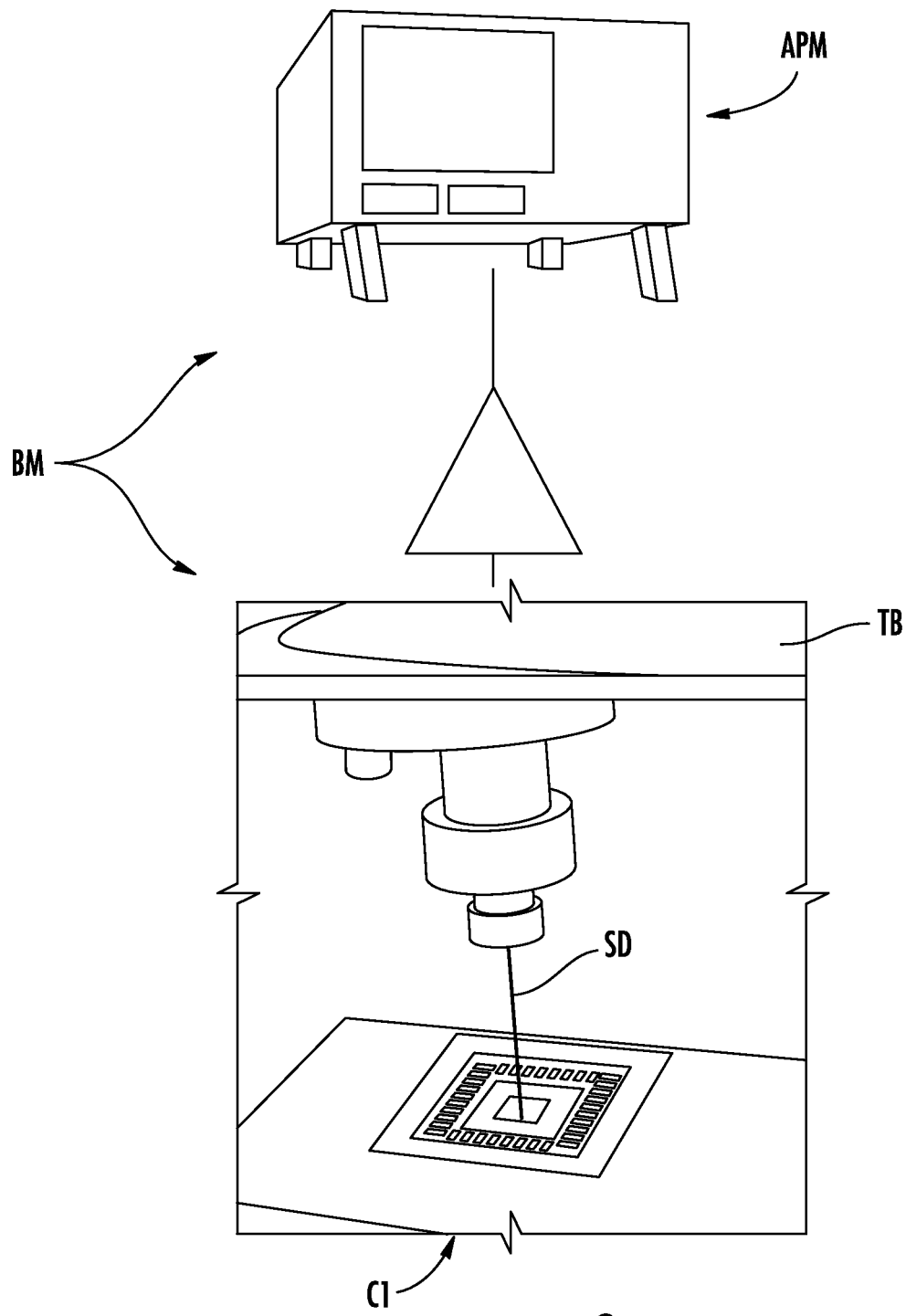

In practice, as illustrated in FIG. 9, the measurement bench BM comprises a table TB on which the probe SD can be moved, which is in turn linked to a measuring instrument APM, for example an oscilloscope.

There are a number of possibilities. It is possible, since the placement of the electrically conductive network REC in the integrated circuit is known, to position the probe SD above the electrically conductive network and move it above pairs of lines while measuring the magnetic field in each analysis window FA.

As a variant, it would be possible to carry out, on a fabricated and customized product, a mapping of the magnetic field comprising, in particular, the part relating to the identification code, and once again carry out a complete scan of the surface of the integrated circuit during an identification procedure, so as to obtain a new map. The comparison of the two maps, including the comparison in the area relating to the identification code, then makes it possible to identify or not identify the integrated circuit.

Figure 10:
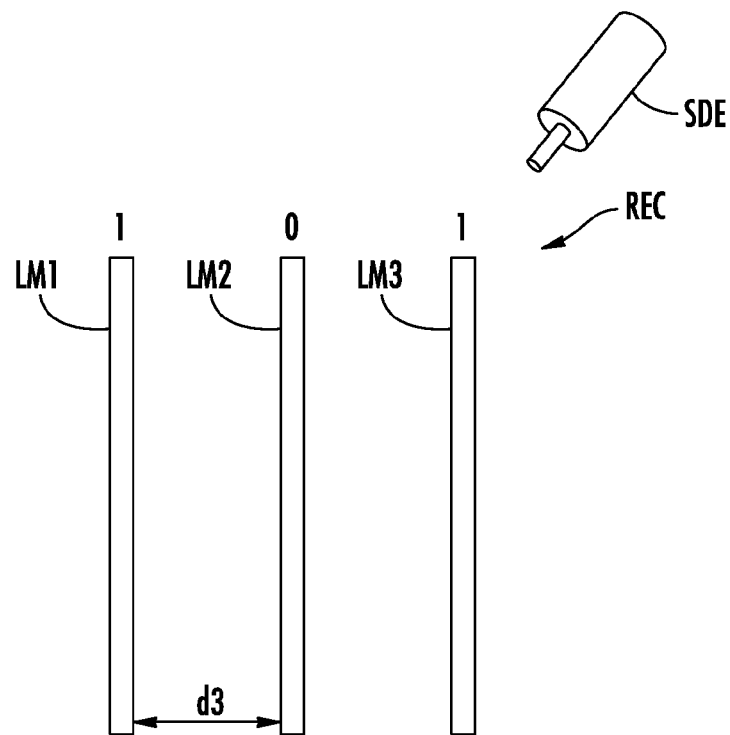

FIG. 10 illustrates another possible variant of the invention.

In this example, the electrically conductive network comprises a number of metal lines LM1, LM2, LM3 that are mutually spaced apart by a distance d3.

In this variant, a voltage variation or transient voltage is generated or not in a metal line according to the value of the bit associated with this metal line.

Thus, for example, for a bit logic value equal to "1", a voltage variation will be generated in the metal line whereas it will not be generated if the value of the bit is equal to "0".

The presence of the electrical field generated is then detected by using a probe SDE which will detect a capacitive coupling or not according to the presence of voltage variation in the metal line.

There again, the distance d3, for example a few hundred micrometres, is chosen to be much greater than the area of analysis of the probe SDE.

Figure 11:
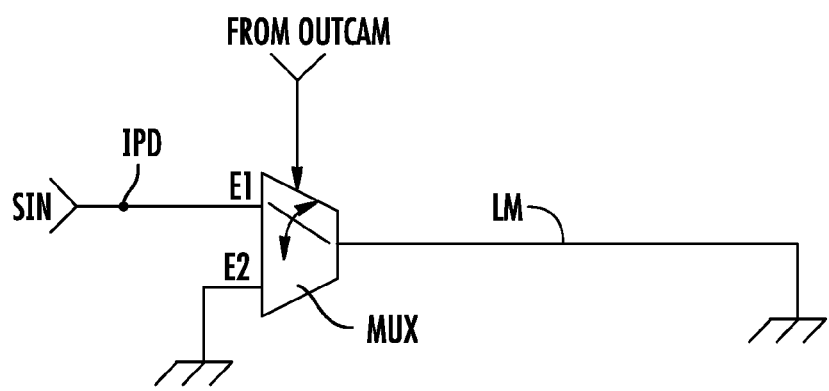

Control means or circuitry MCTL suited to this variant are illustrated in FIG. 11 as a non-limiting example.

More specifically, a multiplexer MUX is connected to one end of each metal line, the other end of this metal line being connected to ground.

The control input of the multiplexer is connected to the output OUTCAM of the memory cell storing the bit associated with this metal line.

The first input E1 of the multiplexer MUX is intended to receive the input signal SIN whereas the second input E2 is linked to ground.

Depending on the logical bit value, the multiplexer is switched to its first input or to its second input, making it possible to generate or not generate a voltage variation in the metal line.

There again, as a variant, it would be possible to leave the right-hand end of the line LM unconnected, so as to reduce the electrical consumption.

That which is claimed:

1. A method of identifying an integrated circuit comprising:
producing an electromagnetic field using an electrically conductive network of the integrated circuit by passing a transient electrical signal through the electrically conductive network, with the transient electrical signal comprising at least one of a transient current and a transient voltage, and with said electrically conductive network comprising at least one pair of electric circuits;
storing, in a non-volatile memory of said integrated circuit, a value of a digital word forming an identification code for the integrated circuit, with the bit of the digital word being associated with at least one of the pair of electric circuits, the characteristics of transient electrical signal being based upon on the value of the digital word and a direction of flow of the transient currents in at least one of the pair of electric circuits;
producing two transient currents having directions based upon the value of the bit using the pair of electric circuits; and
analyzing a magnetic field produced above and between each of the pair of circuits to determine the identification code to thereby identify the integrated circuit.

2. A method according to claim 1, wherein the non-volatile memory comprises an electrically erasable programmable read only memory.

3. An integrated circuit comprising:
a non-volatile memory configured to store a digital word having a value which forms an identification code of the integrated circuit;
control circuitry configured to receive the digital word and to generate at least one of transient electrical currents and transient voltages, characteristics of transient electrical currents and transient voltages being based upon the value of the digital word;
an electrically conductive network comprising at least one pair of electric circuits associated with a bit of the digital word and configured to generate an electromagnetic field based upon the transient electrical currents and the transient voltages; and
said control circuitry being further configured to define a direction of flow of the transient current in one electric circuit of the pair thereof based upon the value of the bit.

4. An integrated circuit according to claim 3, wherein the electrically conductive network comprises a plurality of pairs of electrical circuits mutually spaced apart by a distance greater than an analysis area of magnetic field analysis circuitry, each pair of electrical circuits being associated with a bit of the digital word; and wherein the control circuitry is configured to make two transient currents having a direction depending on the value of the bit associated with a given pair of electrical circuits flow in the given pair of electrical circuits.

5. An integrated circuit according to claim 3, wherein the pair of electric circuits comprises a pair of parallel electrically conductive lines.

6. An integrated circuit according to claim 3, wherein each electrical circuit comprises at least two parallel electrically conductive lines; and wherein the control circuitry is configured to make transient currents in the electrically conductive lines of a given electric circuit flow in a same direction.

7. A method of identifying an integrated circuit comprising:
producing an electromagnetic field using an electrically conductive network of the integrated circuit by passing a transient electrical signal through the electrically conductive network, with the transient electrical signal comprising at least one of a transient current and a transient voltage, and with the electrically conductive network comprising a plurality of pairs of electric circuits mutually spaced apart by a distance greater than an analysis area of magnetic field analysis circuitry;
storing, in a non-volatile memory of said integrated circuit, a value of a digital word forming an identification code for the integrated circuit, the characteristics of transient electrical signal being based upon on the value of the digital word;
with each pair of electric circuits being associated with a bit of the digital word, and making two transient currents having directions depending on the value of the bit associated with a given pair of electric circuits flow in the given pair of electric circuits; and
analyzing a magnetic field produced above and between each of the given pair of electric circuits using the analysis circuitry to determine the identification code to thereby identify the integrated circuit.

8. A method according to claim 7, wherein each pair of electric circuits comprises a pair of parallel electrically conductive lines.

9. A method according to claim 7, wherein each electric circuit comprises at least two parallel electrically conductive lines; and further comprising making transient currents flow in parallel electrically conductive lines of a given electric circuit in a same direction.

10. A method of identifying an integrated circuit comprising:
producing an electromagnetic field using an electrically conductive network of the integrated circuit by passing a transient electrical signal through the electrically conductive network;
storing, in a non-volatile memory of said integrated circuit, a value of a digital word forming an identification code for the integrated circuit, the characteristics of transient electrical signal being based upon on the value of the digital word;
the electrically conductive network comprising at least one electric circuit associated with a bit of the digital word, and with the characteristics of the transient voltages being based upon a voltage variation in the at least one electrical circuit;
generating a voltage variation in the at least one electric circuit according to the value of the bit;
detecting the presence of an electrical field produced above the at least one electrical circuit; and
analyzing the electric field to determine the identification code to thereby identify the integrated circuit.

11. A method according to claim 10, wherein the electrically conductive network comprises a plurality of electrical circuits mutually spaced apart by a distance greater than an analysis area of electrical field analysis circuitry, each electrical circuit being associated with a bit of the digital word; further comprising generating a voltage variation in a given electrical circuit according to the value of the bit associated therewith; and further comprising detecting a presence of an electrical field produced above each electrical circuit.

12. A method according to claim 10, wherein each electric circuit is an electrically conductive line.

13. An integrated circuit comprising:
a non-volatile memory configured to store a digital word having a value which forms an identification code of the integrated circuit;
control circuitry configured to receive the digital word and to generate at least one of transient electrical currents and transient voltages, characteristics of transient electrical currents and transient voltages being based upon the value of the digital word;
an electrically conductive network comprising at least one electric circuit associated with a bit of the digital word and configured to generate an electromagnetic field based upon the transient electrical currents and the transient voltages; and
said control circuitry being further configured to generate a voltage variation in a given electric circuit based upon the value of the bit.

14. An integrated circuit according to claim 13, wherein the electrically conductive network comprises a plurality of electric circuits mutually spaced apart by a distance greater than an analysis area of electrical field analysis circuitry, each electrical circuit being associated with a bit of the digital word; and wherein the control circuitry is configured to generate in each electrical circuit a voltage variation according to the value of the bit associated therewith.

15. An integrated Circuit according to claim 13, wherein each electrical circuit comprises an electrically conductive line.

16. An integrated circuit comprising:
a non-volatile memory configured to store a digital word having a value which forms an identification code of the integrated circuit;
control circuitry configured to receive the digital word and to generate at least one of transient electrical currents and transient voltages, characteristics of transient electrical currents and transient voltages being based upon the value of the digital word;
an electrically conductive network configured to generate an electromagnetic field based upon the transient electrical currents and the transient voltages; and
an interconnection portion comprising a metallization level, with said electrically conductive network being incorporated in said metallization level.

* * * * *